United States Patent
Chen et al.

(10) Patent No.: US 11,348,958 B2
(45) Date of Patent: May 31, 2022

(54) IMAGE SENSING DEVICE WITH GRID STRUCTURE AND FABRICATION METHOD THEREOF

(71) Applicant: TAIWAN SEMICONDUCTOR MANUFACTURING COMPANY LTD., Hsinchu (TW)

(72) Inventors: Yun-Hao Chen, Hsinchu (TW); Kuo-Yu Wu, Hsinchu County (TW); Tse-Hua Lu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/414,498

(22) Filed: May 16, 2019

(65) Prior Publication Data
US 2020/0365636 A1    Nov. 19, 2020

(51) Int. Cl.
*H01L 27/146*  (2006.01)

(52) U.S. Cl.
CPC .... *H01L 27/14621* (2013.01); *H01L 27/1463* (2013.01); *H01L 27/14603* (2013.01); *H01L 27/14645* (2013.01)

(58) Field of Classification Search
CPC .......... H01L 27/1464; H01L 27/14627; H01L 27/14621; H01L 27/14643; H01L 27/14645; H01L 27/14629; H01L 27/1463; H01L 27/14603; H01L 27/1403
USPC ...................................................... 257/432
See application file for complete search history.

(56) References Cited

U.S. PATENT DOCUMENTS

| | | | |
|---|---|---|---|
| 6,815,787 B1 | 11/2004 | Yaung et al. | |
| 7,470,965 B2* | 12/2008 | Kuriyama | H01L 27/14621 257/443 |
| 7,883,926 B2* | 2/2011 | Shiau | H01L 27/14687 438/70 |
| 8,390,089 B2 | 3/2013 | Chen et al. | |
| 8,674,469 B2 | 3/2014 | Huang et al. | |
| 8,709,854 B2 | 4/2014 | Chuang et al. | |
| 8,981,510 B2 | 3/2015 | Chuang et al. | |
| 9,064,989 B2* | 6/2015 | Wang | H01L 27/14621 |
| 9,818,782 B2* | 11/2017 | Kim | H01L 27/1463 |
| 2012/0261781 A1* | 10/2012 | Hsu | H01L 27/1464 257/432 |
| 2014/0077323 A1* | 3/2014 | Velichko | H01L 27/14629 257/432 |
| 2014/0175586 A1* | 6/2014 | Kim | H01L 27/1464 257/432 |
| 2015/0171125 A1* | 6/2015 | Jangjian | H01L 27/14685 257/432 |
| 2015/0243805 A1* | 8/2015 | Chien | H01L 27/1464 257/432 |
| 2015/0263054 A1* | 9/2015 | Chien | H01L 27/1464 257/292 |
| 2016/0064433 A1* | 3/2016 | Chang | H01L 27/14623 257/432 |

(Continued)

*Primary Examiner* — Khiem D Nguyen
(74) *Attorney, Agent, or Firm* — WPAT, P.C. Intellectual Property Attorneys; Anthony King

(57) ABSTRACT

The present disclosure provides an optical structure, including a substrate, a light detection region in the substrate, an isolation structure in the substrate, surrounding the light detection region, a color filter layer over the substrate, and a dielectric grid structure in the color filter layer, the dielectric grid structure overlapping with the light detection region.

20 Claims, 18 Drawing Sheets

(56) References Cited

U.S. PATENT DOCUMENTS

| | | | |
|---|---|---|---|
| 2016/0172394 A1* | 6/2016 | Lee .................. | H01L 27/14621 |
| | | | 257/432 |
| 2016/0225802 A1* | 8/2016 | Lin ..................... | H01L 27/1464 |
| 2016/0276394 A1* | 9/2016 | Chou ................ | H01L 27/14621 |
| 2016/0307942 A1* | 10/2016 | Cheng ............... | H01L 27/14623 |
| 2017/0077163 A1* | 3/2017 | Chou ................ | H01L 27/14685 |
| 2017/0301718 A1* | 10/2017 | Chou ................ | H04N 5/36961 |
| 2018/0040656 A1* | 2/2018 | Jang .................. | H01L 27/1463 |
| 2018/0166475 A1* | 6/2018 | Chen .................. | H01L 27/1463 |

* cited by examiner

IMAGE SENSING DEVICE WITH GRID STRUCTURE AND FABRICATION METHOD THEREOF

BACKGROUND

Digital cameras and other optical imaging devices often employ optical structures such as semiconductor image sensors. Optical structures can be used to sense radiation and may convert optical images to digital data that may be represented as digital images. For example, complementary metal-oxide-semiconductor (CMOS) image sensors (CIS) and charge-coupled device (CCD) sensors are widely used in various applications such as digital camera, mobile phone, detector, or the like. The optical structures utilize light detection regions to sense light, wherein the light detection regions may include pixel array, illumination image sensor (such as back side illumination image sensor, which can be referred to as BSI image sensor), or other type of image sensor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
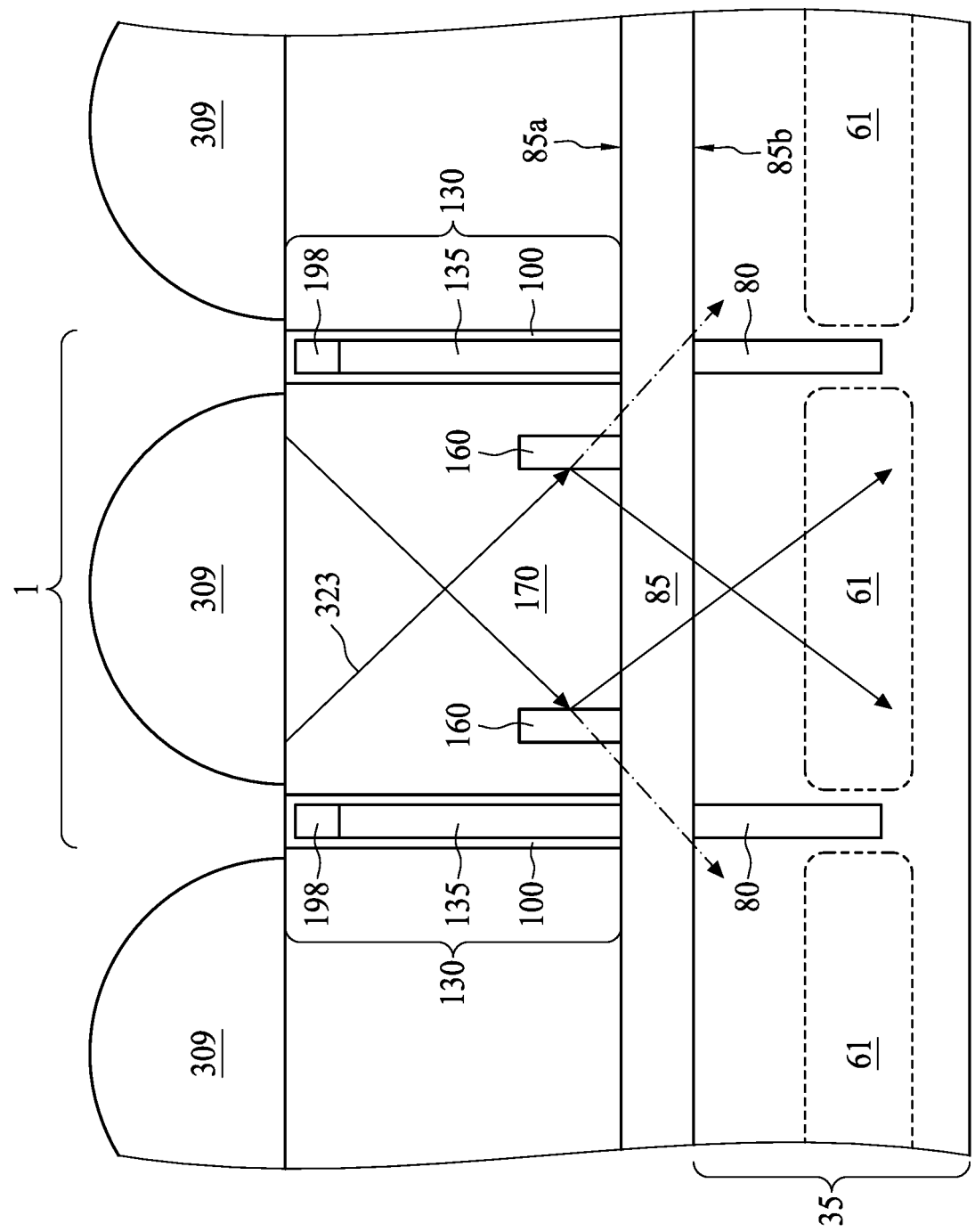
FIG. 1A is a cross sectional view of an optical structure, according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Light detection devices includes front side illumination (FSI) image sensors, back side illumination (BSI) image sensors, both having an array of pixel sensors, or other suitable image sensor design. A challenge of image sensors is cross-talk between adjacent light detection regions, or adjacent pixels. Optical cross-talk may occur when photons that are intended to be received by one light detection region, but end up being erroneously received by a neighboring light detection region. Such result may degrade the performance, for example, the resolution, of the image sensor. As image sensors become smaller and smaller throughout development, the risk of cross-talk increases accordingly. Specifically, when a width of a pixel of an image sensor becomes less than 1 micron, the risk of cross-talk significantly increases.

On the other hand, quantum efficiency (QE) is also a figure of merit as far as an image sensor is concerned. Incident light may not penetrate through metallic materials, or metallic material is opaque to photons. When metallic structure is presented in an image sensor, the photon impinging to such metallic structure may not contribute to electron generated, and therefore the QE of such image sensor may be reduced.

The present disclosure provides an optical structure including a grid structure to improve optical isolation between adjacent light detection regions to alleviate crosstalk without considerably trading off quantum efficiency (QE).

Referring to FIG. 1A, FIG. 1A is a cross sectional view of an optical structure, according to some embodiments of present disclosure. An optical structure 1 at least includes a substrate 35 and a light detection region 61. The optical structure 1 may further include a primary grid structure 130, a secondary grid structure 160, an isolation structure 80, a lens 309, a color filter 170, and a light transmission layer 85.

In some embodiments, the substrate 35 is a p-type semiconductor substrate (P-Substrate) or an n-type semiconductor substrate (N-Substrate) comprising silicon. In some other alternative embodiments, the substrate 35 includes other elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the substrate 35 is a semiconductor on insulator (SOI). In some other embodiments, the substrate 35 may include an epitaxial layer, a gradient semiconductor layer, and/or a semiconductor layer overlying another different type semiconductor layer, such as a silicon layer on a silicon germanium layer. The substrate 35 may or may not include doped regions, such as a p-well, an n-well, or combination thereof.

The isolation structure 80 is in the substrate 35. In some embodiments, the isolation structure 80 may be a deep trench isolation (DTI), such as a backside deep trench isolation (BDTI). In some embodiments, the isolation structure 80 may include a dielectric material, which may include oxide, nitride, or other suitable material that can be utilized as an isolation feature. For example, the isolation structure 80 may include silicon oxide ($SiO_2$), hafnium oxide ($HfO_2$), or the like. In some embodiments, a refractive index of the isolation structure 80 is less than a refractive index of silicon. In some embodiments, the isolation structure 80 may optionally include a liner (not shown in FIG. 1A) at a sidewall of the isolation structure 80 to alleviate cross-talk issue. In some embodiments, the liner is a doped region surrounding the aforesaid dielectric material. The light detection region 61 is surrounded by the isolation structure 80 from a top view perspective. The light detection region 61 may include a light detection sensor, such as a pixel of a pixel array, and a plurality of light detection regions 61 may be arranged in an array arrangement. In some embodiments, the pixel of the light detection region 61 is a sub-micron level pixel which has a width less than 1 micron.

The light transmission layer 85 is disposed over the substrate 35 and the isolation structure 80. The light transmission layer 85 has a first side 85a opposite to the substrate 35 and a second side 85b facing the substrate 35. The light transmission layer 85 may include oxide dielectric (such as silicon oxide, hafnium oxide, spin-on glass, fluoride-dopes silicate glass, undoped silica glass, or the like), antireflective coating (ARC), a multilayer structure of oxide dielectric and/or ARC, or the like. A material of the light transmission layer 85 may, or may not be the same with a material of the dielectric material of the isolation structure 80. For the sake of simplicity, only the light detection region 61 (which can be deemed as a portion of a pixel array region) is shown in FIG. 1A to FIG. 1C and FIG. 4 to FIG. 14. In some embodiments, the substrate 35 further includes various regions, which may further include a periphery region (which may include non-radiation-sensing devices, input/output circuitry, or logic circuitry, etc.), a bonding pad region, and/or a scribe line region. In some embodiments, the light detection sensor in the light detection region 61 is electrically connected to a bonding pad (not shown in FIG. 1A), wherein the light detection region 61 and the bonding pad may be on the second side 85b of the light transmission layer 85b, in some of the embodiments.

Figure 1B:
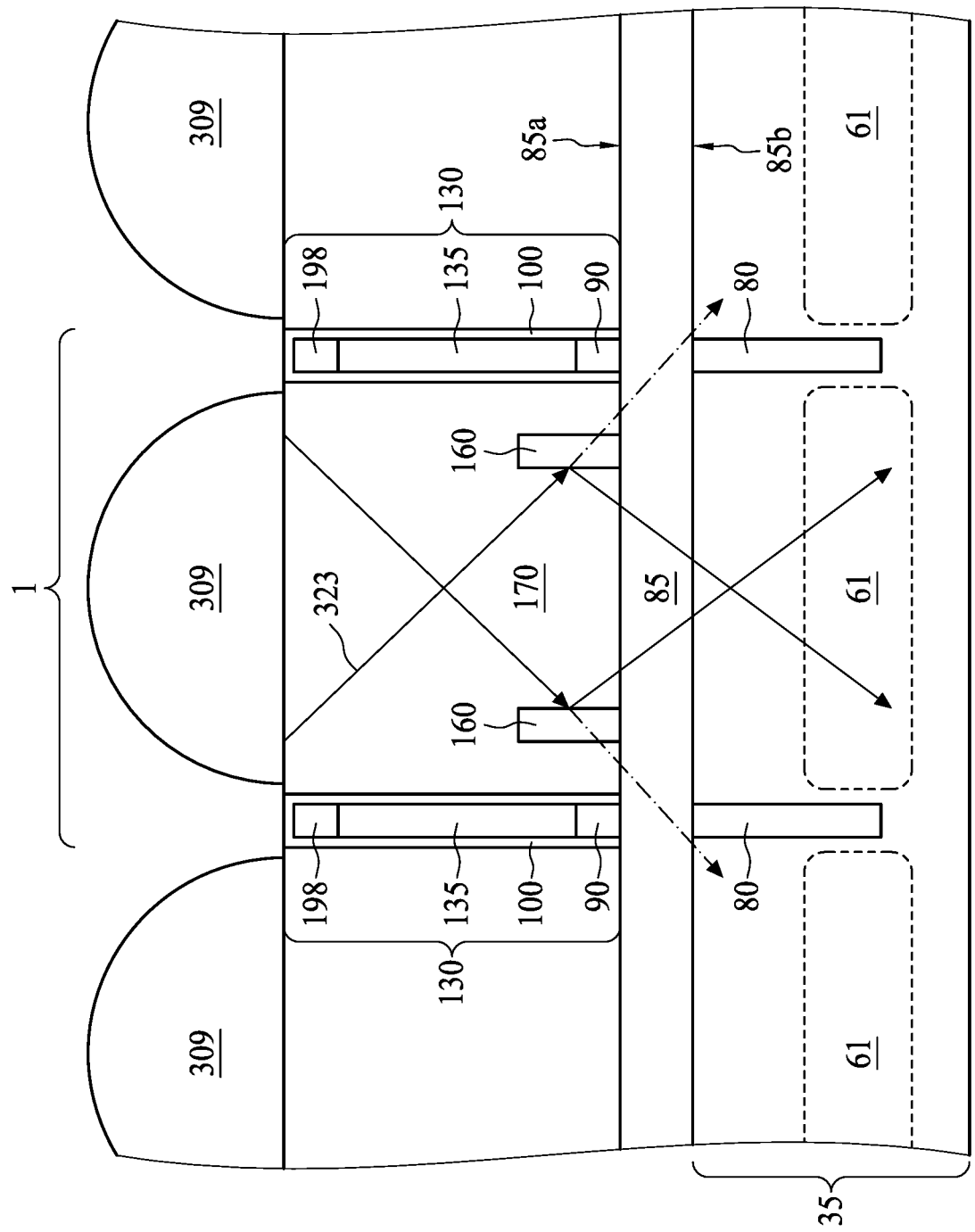
FIG. 1B is a cross sectional view of an optical structure, according to some embodiments of present disclosure.
Figure 1C:
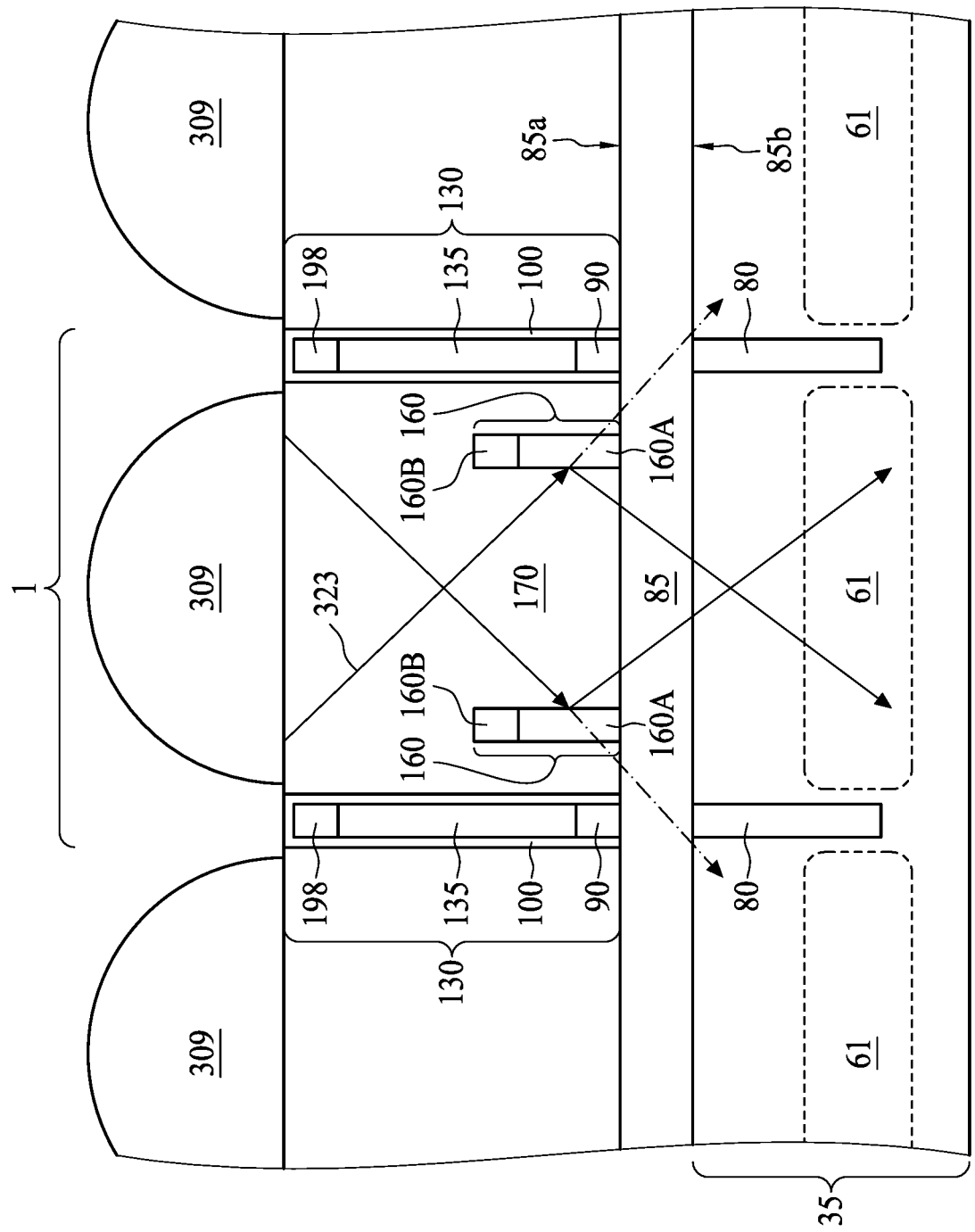
FIG. 1C is a cross sectional view of an optical structure, according to some embodiments of present disclosure.
Figure 2A:
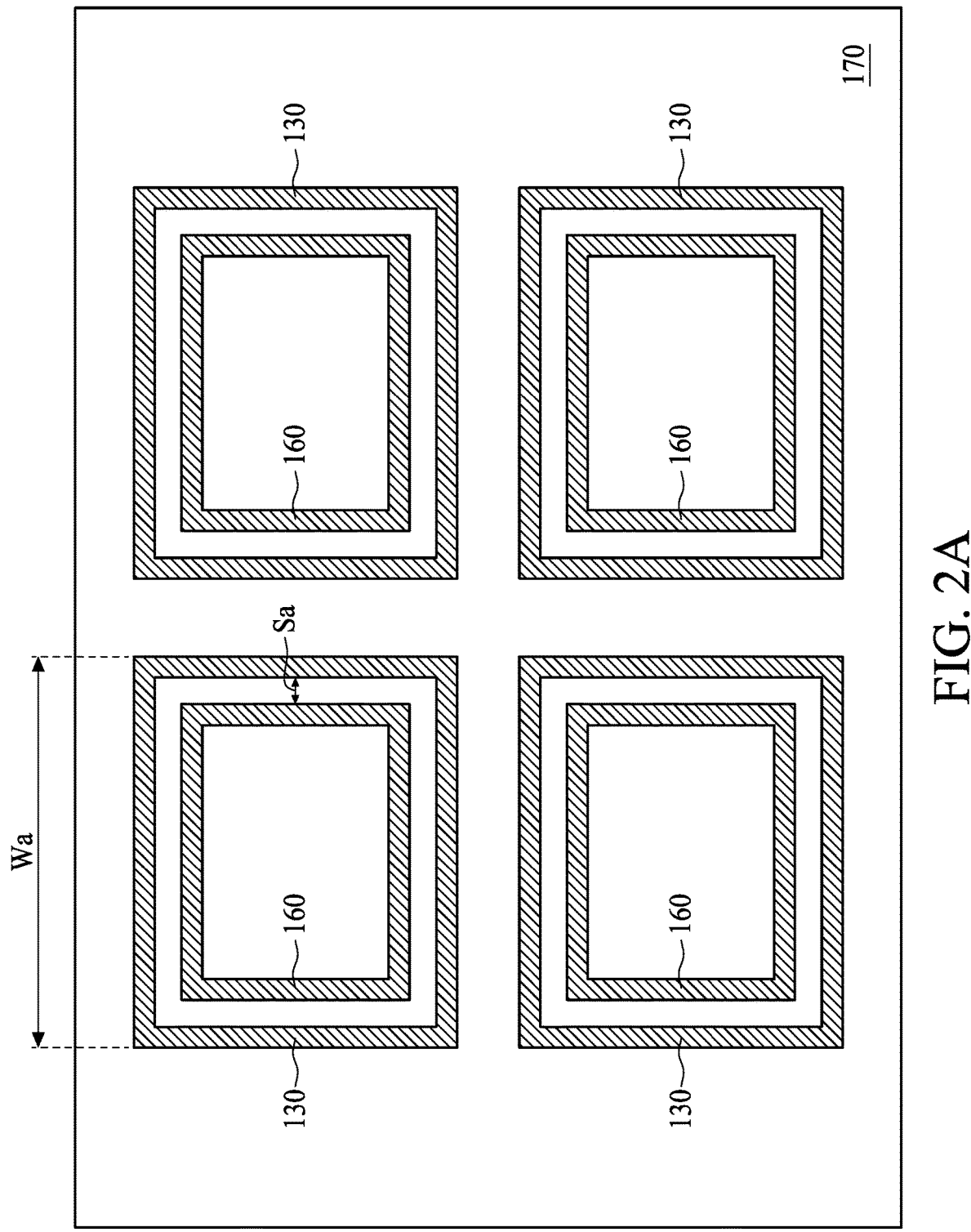
FIG. 2A is a top view perspective of an optical structure, according to some embodiments of present disclosure.
Figure 2B:
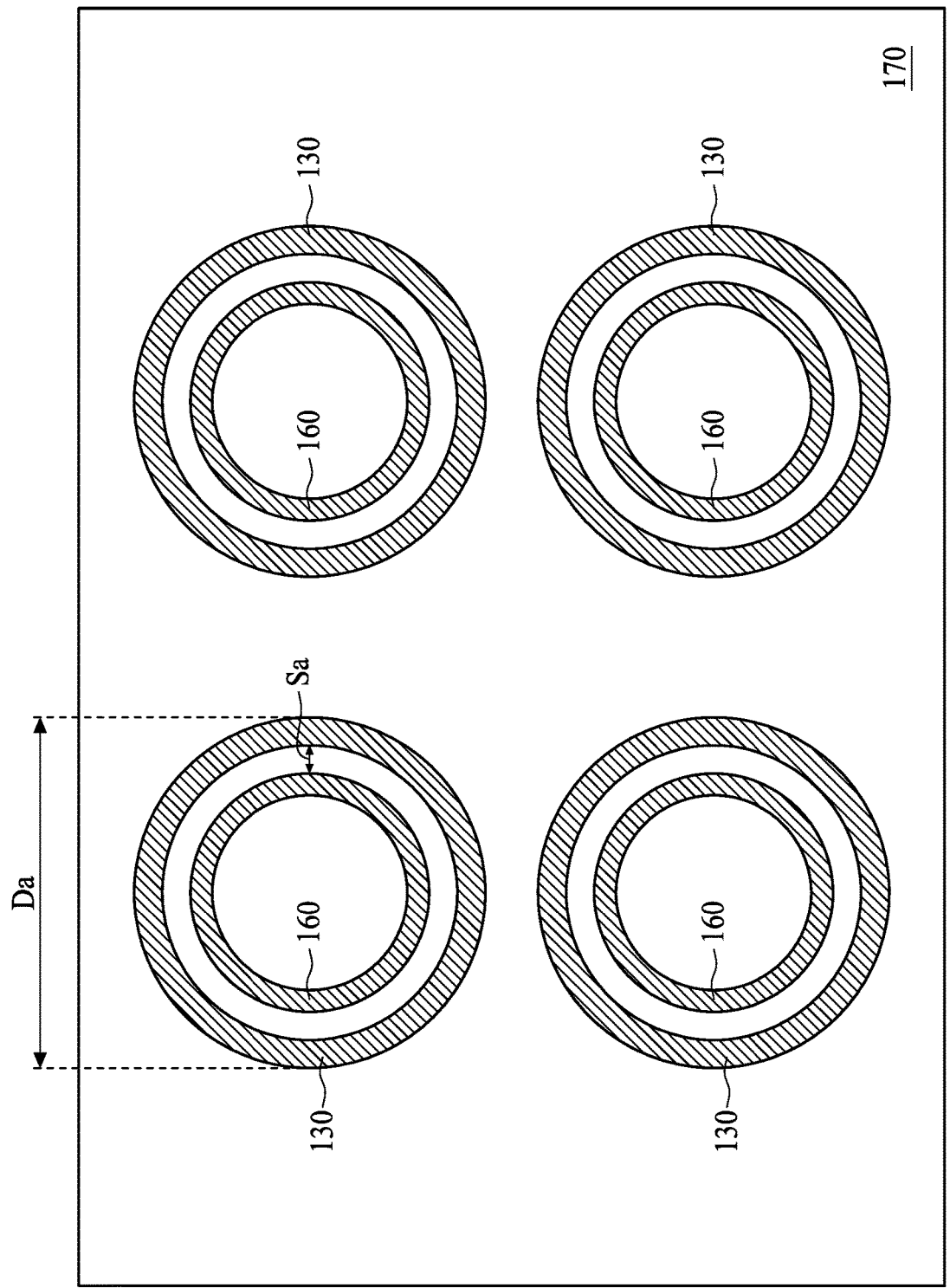
FIG. 2B is a top view perspective of an optical structure, according to some embodiments of present disclosure.

Referring to FIG. 1A, FIG. 2A, and FIG. 2B, FIG. 2A is a top view perspective of an optical structure in one embodiment, FIG. 2B is a top view perspective of an optical structure in another embodiment. A primary grid structure 130 and a secondary grid structure 160 are disposed above the first side 85a of the light transmission layer 85. In some embodiments, the primary grid structure 130 is aligning above the isolation structure 80, and the secondary grid structure 160 is laterally surrounded by the primary grid structure 130. As shown in FIG. 2A and FIG. 2B, the primary grid structure 130 and the secondary grid structure 160 may have a circular shape or a tetragonal shape from a top view perspective. In some embodiments, the primary grid structure 130 is vertically aligned with the isolation structure 80, and a width Wa or a diameter Da of the primary grid structure 130 may be identical to or approximate to a width or a diameter of a pixel of the light detection region 61 or a width or a diameter of the light detection region 61, which may be less than 1 micron. A separation Sa between an inner surface of the primary grid structure 130 and an outer surface of the secondary grid structure 160 may be in a range from about 0.1 micron to about 0.5 micron. The material of the primary grid structure 130 and the secondary grid structure 160 will be subsequently discussed in FIG. 1A to FIG. 1C. Although showing in a continuous circle or tetragonal shape in FIG. 2A and FIG. 2B, the primary and secondary grid structures may be of non-continuous patterns according to various designs. In some other embodiments, the optical structure further includes a tertiary grid, a quaternary grid, a quinary grid . . . or the like. The number of grids for serving purpose(s) similar to the primary grid structure 130 and/or the secondary grid structure 160 above the light detection region 61 is not limited in the present disclosure. In some of the embodiments, the tertiary grid, the quaternary grid, or the quinary grid may be surrounded by the primary grid structure 130. For the purpose of conciseness, the tertiary grid, the quaternary grid, the quinary grid, or the like, are not shown in FIG. 1A to FIG. 2B.

The color filter 170 is disposed over the first side 85a of the light transmission layer 85, wherein the primary grid structure 130 and the secondary grid structure 160 are in the color filter 170. The first side 85a of the light transmission layer 85 may directly contact the color filter 170. A certain frequency of light can pass through the color filter 170, for example, the color filter 170 can selectively pass any one of the red, green, or blue (R/G/B) light toward the light transmission layer 85. In some embodiments, the color filters of a plurality of neighboring optical structures 1 are arranged in Bayer pattern, but the present disclosure is not limited thereto. In some embodiments, the color filter 170 may include organic dielectric, such as polymer. In some embodiments, a thickness of the color filter 170 is identical with a height of the primary grid structure 130. Alternatively in some other embodiments, a thickness of the color filter 170 is greater than a height of the primary grid structure 130.

The optical structure 1 may further include a lens 309 above the color filter 170 and aligning with a light detection region 61. The lens 309 faces the first side 85a of the light transmission layer 85. In some embodiments, the lens 309 may be a condensing lens, which may have a semi-ellipsoid, a hemisphere shape, or other suitable shape. A size of the lens 309 may be comparable to the size of the primary grid structure 130 from a top view perspective.

As shown in FIG. 1A, in some embodiments, the primary grid structure 130 includes an oxide section 135 above the light transmission layer 85, which may include silicon oxide ($SiO_2$), hafnium oxide ($HfO_2$), or the like. A refractive index of the oxide section 135 is less than a refractive index of the color filter 170. The oxide section 135 may serve as a light guide due to the difference of the refractive index between the oxide section 135 and the color filter 170. Specifically, reflection may occur when light 323 in the color filter 170 strikes an inner surface of the oxide section 135 (or a boundary between the primary grid structure 130 and the color filter 170). Furthermore, the oxide section 135 has a lower light absorbance than metal, thus the quantum efficiency (QE) in current embodiment may be greater than a comparative embodiment where the primary grid structure is composed of metal. In some comparative embodiments where no secondary grid 160 is presented, the light 323 with specific incident angle may reach and pass through the light transmission layer 85, ending up in an adjacent light detection region 61, as demonstrated in dashed-dotted lines of FIG. 1A.

In some embodiments, the primary grid structure 130 may further include a antireflective coating (ARC) layer 198 above the oxide section 135, wherein the ARC layer 198 is vertically aligned with the oxide section 135. In some embodiments, the primary grid structure 130 may further include a dielectric layer 100 surrounding the primary grid structure 130. A material of the dielectric layer 100 may be identical with a material of the secondary grid structure 160, which will be subsequently discussed in FIG. 12. In some alternative embodiments, the primary grid structure 130 and/or the secondary grid structure 160 includes a single material, such as a dielectric material, organic material, or metallic material. In some embodiments, material of the primary grid structure 130 may, or may not be identical with that of the secondary grid structure 160.

Referring to FIG. 1B, FIG. 1B is a cross sectional view of an optical structure, according to some embodiments of present disclosure. Alternatively in some other embodiments, the primary grid structure 130 is a composite grid structure, which includes a metal section, an oxide section, and/or an organic section. For example, the composite grid structure include a metal section 90 above the light transmission layer 85, and an oxide section 135 above the metal section 90. The metal section 90 may block light impinging thereon by absorbing the photon, therefore preventing the photon from traveling toward adjacent light detection regions 61. Alternatively stated, the metal section 90 may possess the capability of alleviating the cross-talk issue better than that of the oxide section 135. In some embodiments, the metal section 90 may include metal, such as copper, tungsten, aluminum copper, or the like. However, the degradation of quantum efficiency (QE) of the optical structure 1 may exacerbate since the metal section 90 may have a relatively higher light absorbance. Therefore, a height of the metal section 90 is limited to a certain extent to avoid significant degradation of quantum efficiency (QE), and the oxide section 135 is disposed above the metal section 90. Herein a refractive index of the oxide section 135 is lower than a refractive index of the color filter 170 (which can also serve as a light guide, as previously discussed), and the oxide section 135 has a lower light absorbance than metal, thus the degradation of quantum efficiency (QE) caused by the primary grid structure 130 can be alleviated. The oxide section 135 may include oxide such as silicon oxide ($SiO_2$), hafnium oxide ($HfO_2$), or the like. It is noteworthy that a refractive index of the metal section 90 is lower than a refractive index of the color filter 170, and the oxide section 135 may also be replaced by any other suitable reflective material that has a refractive index lower than a refractive index of the color filter 170. In some embodiments, the composite grid structure may further include an ARC layer 198 over the oxide section 135 and/or a dielectric layer 100 surrounding the primary grid structure 130. A material of the dielectric layer 100 may be identical with a material of the secondary grid structure 160, which will be subsequently discussed.

Referring to FIG. 1C, FIG. 1C is a cross sectional view of an optical structure, according to some embodiments of present disclosure. In some alternative embodiments, the primary grid structure 130 and/or the secondary grid structure 160 includes composite material, for example, a combination of dielectric material and metallic material, a combination of organic material and metallic material, or the like. For example, the secondary grid structure 160 includes two or more sections, such as a first section 160A and a second section 160B different from the first section 160A as shown in FIG. 1C (wherein the sections are collectively referred to as the secondary grid structure 160).

Referring to FIG. 1A, FIG. 1B and FIG. 1C, the secondary grid structure 160 surrounded by the primary grid structure 130 is disposed above the first side 85a of the light transmission layer 85 to further alleviate cross-talk issue, wherein the secondary grid structure 160 overlaps with the light detection region 61 from top view perspective, and the primary grid structure 130 is closer to the isolation structure 80 than the secondary grid 160. Specifically, there's a risk of light 323 passing through the light transmission layer 85 between the primary grid structure 130 and the isolation structure 80, and thereby erroneously received by adjacent light detection region 61 (as shown as a dashed-dotted line in FIG. 1A, FIG. 1B and FIG. 1C). In order to hinder light 323 from being erroneously received by adjacent light detection region 61, the secondary grid structure 160 has a refractive index of the secondary grid structure 160 is less than a refractive index of the color filter 170. The secondary grid structure 160 may serve as a light guide due to the difference of the refractive index between the secondary grid structure 160 and the color filter 170. In some embodiments, the light 323 reflected off the secondary grid structure 160 may be guided to the intended light detection region 61. Specifically, reflection may occur when light in the color filter 170 strikes a boundary between the secondary grid structure 160 and the color filter 170. Furthermore, the secondary grid structure 160 has a lower light absorbance than metal, thus the degradation of quantum efficiency (QE) caused by the secondary grid structure 160 can be alleviated. In some embodiments, the secondary grid structure 160 is a dielectric grid structure, such as an oxide grid, or other suitable low refractive index grid. For example, the secondary grid structure 160 may include silicon oxide ($SiO_2$), hafnium oxide ($HfO_2$), or the like. In some embodiments, a height of the secondary grid structure 160 is less than a height of the primary grid structure 130, since it may not require a height of the secondary grid structure 160 to be identical with a height of the primary grid structure 130 to effectively hinder the light 323 from passing through the light transmission layer 85 between the primary grid structure 130 and the isolation structure 80, and on the other hand, may instead cause degradation of quantum efficiency (QE).

In some of the embodiments, the effectiveness of color filter 170 with regard to filtering the certain frequency of light may be affected by the incorporation of the secondary grid structure 160 due to the decreased amount of the color filter 170. Therefore in some embodiments, the height of the secondary grid structure 160 may be less than 0.5 micron (or in some embodiments from about 0.1 micron to about 0.5 micron), while a thickness of the color filter 170 and a height of the primary grid structure 130 may be added in accordance with the height of the secondary grid structure 160 to compensate the deceased effectiveness of color filter 170 stems from the incorporation of the secondary grid structure 160. Alternatively stated, in some embodiments, the thickness of the color filter is associated with the height of the secondary grid in a sense that compared to the embodiment where no secondary grid is presented, the thickness of the color filter in current embodiment may be greater than the one without secondary grid. For example, the thickness of the color filter in current embodiment may be greater than the thickness of the color filter without secondary grid by the thickness of the secondary grid. The excess thickness in current embodiment may compensate the deficient color filtering efficiency resulted from the presence of the secondary grid.

Figure 3A:
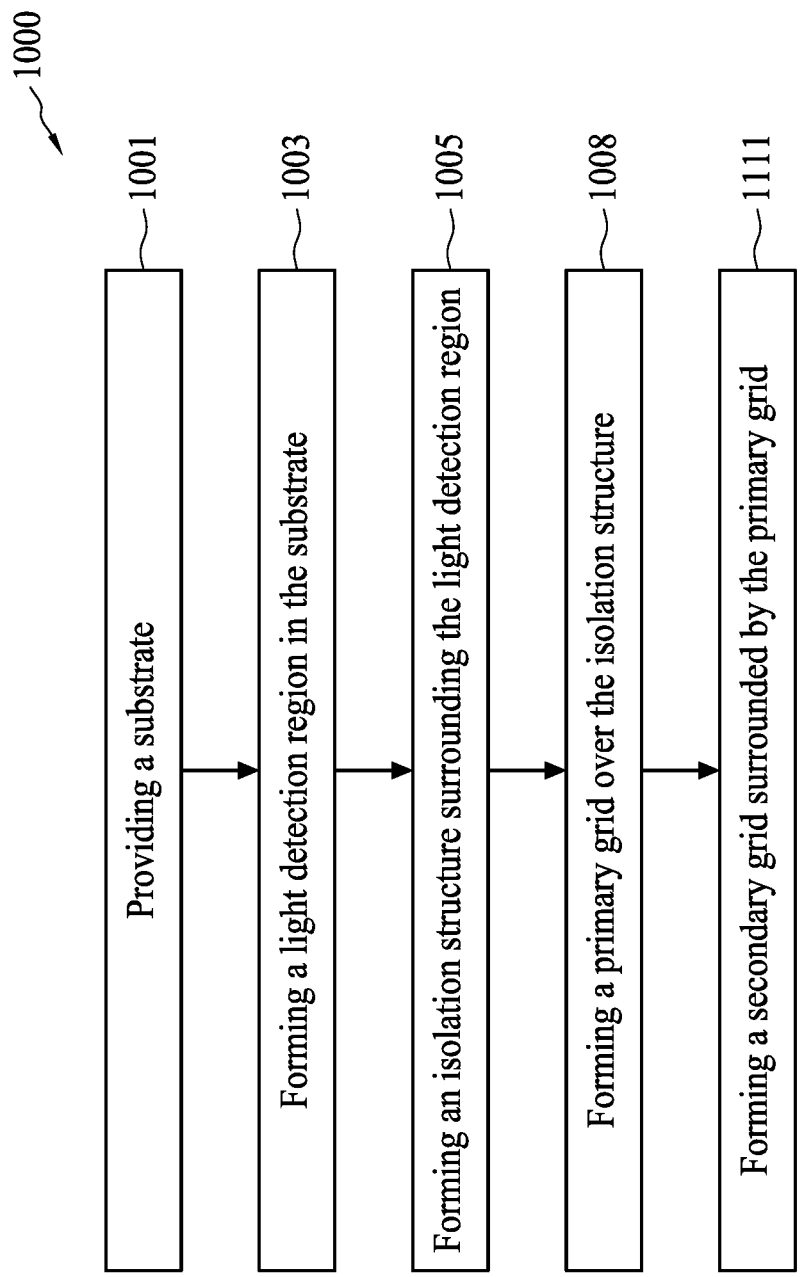
FIG. 3A shows a flow chart representing a method for fabricating an optical structure, in accordance with some embodiments of the present disclosure.

Referring to FIG. 3A, FIG. 3A shows a flow chart representing a method for fabricating an optical structure, in accordance with some embodiments of the present disclosure. The method 1000 for fabricating an optical structure includes providing a substrate (operation 1001, which can be referred to FIG. 4), forming a light detection region in the substrate (operation 1003, which can be referred to FIG. 4), forming an isolation structure surrounding the light detection region (operation 1005, which can be referred to FIG. 4), forming a primary grid over the isolation structure (operation 1008, which can be referred to FIG. 6 to FIG. 7), and forming a secondary grid surrounded by the primary grid (operation 1111, which can be referred to FIG. 8 to FIG. 12).

Figure 3B:
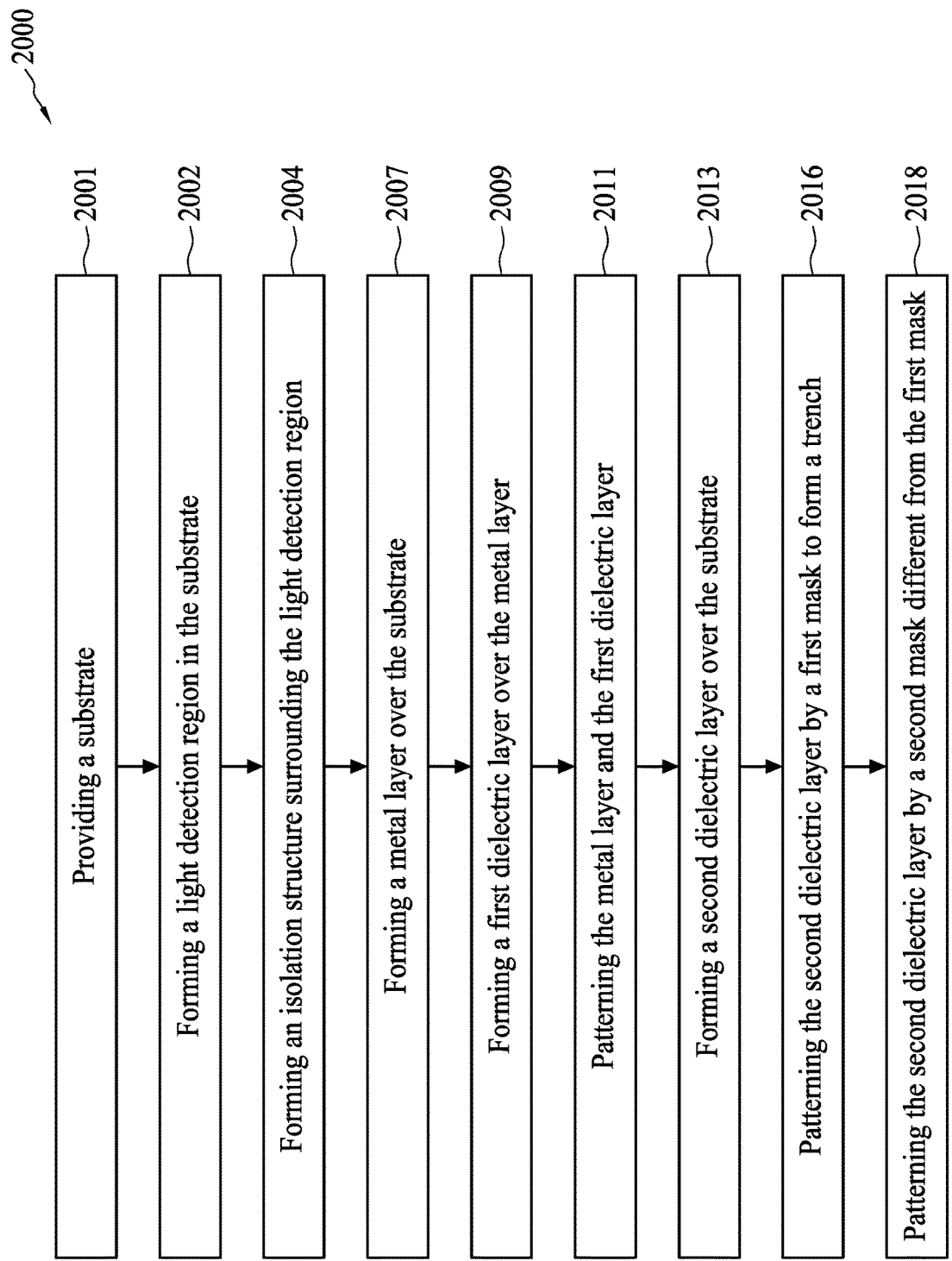
FIG. 3B shows a flow chart representing a method for fabricating an optical structure, in accordance with some embodiments of the present disclosure.

Referring to FIG. 3B, FIG. 3B shows a flow chart representing a method for fabricating an optical structure, in accordance with some embodiments of the present disclosure. The method 2000 for fabricating an optical structure includes providing a substrate (operation 2001, which can be referred to FIG. 4), forming a light detection region in the substrate (operation 2002, which can be referred to FIG. 4), forming an isolation structure surrounding the light detection region (operation 2004, which can be referred to FIG. 4), forming a metal layer over the substrate (operation 2007, which can be referred to FIG. 5), forming a first dielectric layer over the metal layer (operation 2009, which can be referred to FIG. 6), patterning the metal layer and the first dielectric layer (operation 2011, which can be referred to FIG. 7), forming a second dielectric layer over the substrate (operation 2013, which can be referred to FIG. 8), patterning the second dielectric layer by a first mask to form a trench (operation 2016, which can be referred to FIG. 9), and patterning the second dielectric layer by a second mask different from the first mask (operation 2018, which can be referred to FIG. 10 to FIG. 12).

Figure 4:
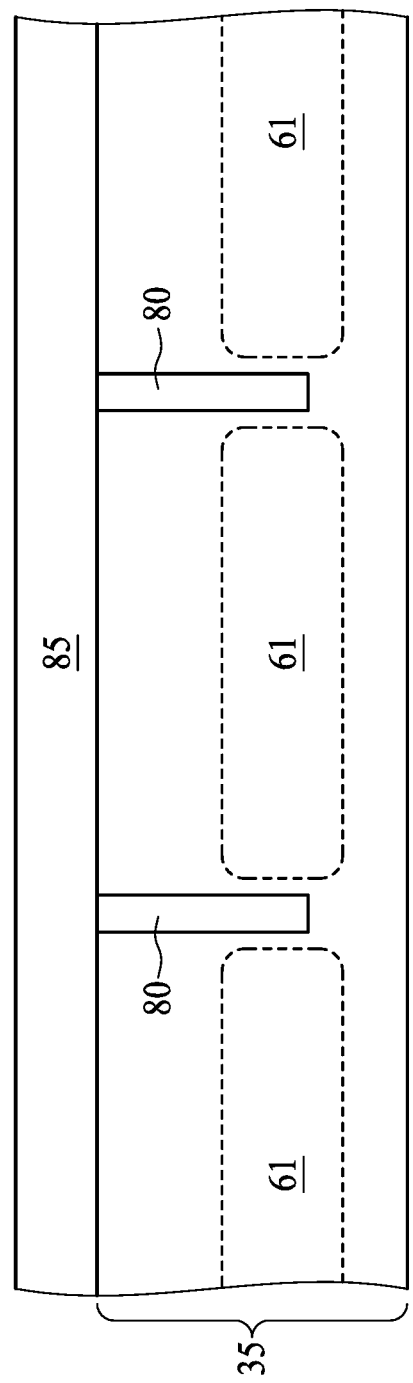
FIG. 4 to FIG. 14 are cross sectional views of an optical structure during intermediate stages of manufacturing operations, according to some embodiments of present disclosure.

Referring to FIG. 4, FIG. 4 is a cross sectional view of an optical structure during intermediate stages of manufacturing operations, according to some embodiments of present disclosure. A substrate 35 as previously discussed in FIG. 1A is provided, and at least one light detection region 61 as well as an isolation structure 80 surrounding a light detection region 61 from a top view perspective are formed in the substrate 35. The light detection region 61 may be formed by disposing a light detection sensor in the substrate 35, wherein the light detection sensor can be an optical pixel, or the like. In some embodiments, the optical pixel (not shown in FIG. 4) of the light detection region 61 is a sub-micron level pixel which has a width less than 1 micron.

The isolation structure 80 is formed in the substrate 35. In some embodiments, the isolation structure 80 may be a deep trench isolation (DTI), such as a backside deep trench isolation (BDTI). In some embodiments, the isolation structure 80 is formed by forming a deep trench, performing a plasma diffusion operation involving plasma-immersion ion implantation to form a doped trench liner surrounding the deep trench, subsequently depositing a dielectric material (such as an oxide material or a nitride material, for example silicon oxide ($SiO_2$), hafnium oxide ($HfO_2$), or the like) in the deep trench, and thereafter removing a portion of the dielectric material outside of the deep trench by performing a chemical mechanical planarization (CMP) operation. The deep trench may be formed by etching operations (wet etching or dry etching) or photolithography patterning followed by reactive ion etching (RIE); and the deposition of the dielectric material may involve a variety of techniques, such as chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), physical vapor deposition (PVD), atomic layer deposition (ALD), sputtering, and/or other suitable operations. It is noteworthy that a refractive index of the isolation structure 80 may be less than a refractive index of silicon.

Subsequently, the light transmission layer 85 is formed over the substrate 35 and the isolation structure 80. The light transmission layer 85 may include oxide dielectric (such as silicon oxide, hafnium oxide, spin-on glass, fluoride-dopes silicate glass, undoped silica glass, or the like), antireflective coating (ARC), a multilayer structure of oxide dielectric and/or ARC, or the like. The light transmission layer 85 may be formed by a variety of techniques, such as chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), coating, spin-on, sputtering, and/or other suitable operations.

Figure 5:
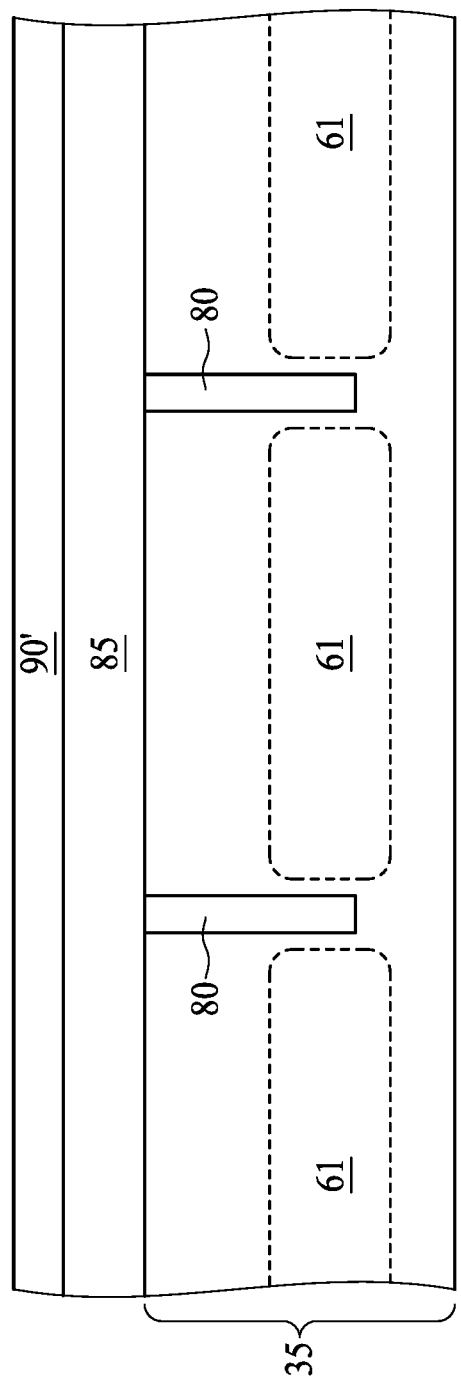

Referring to FIG. 5, FIG. 5 is a cross sectional view of an optical structure during intermediate stages of manufacturing operations, according to some embodiments of present disclosure. Optionally, a metal layer 90' is subsequently formed above the light transmission layer 85 when a composite grid is to be formed. The metal layer 90' may include metal, such as copper, tungsten, aluminum copper, or the like.

Figure 6:
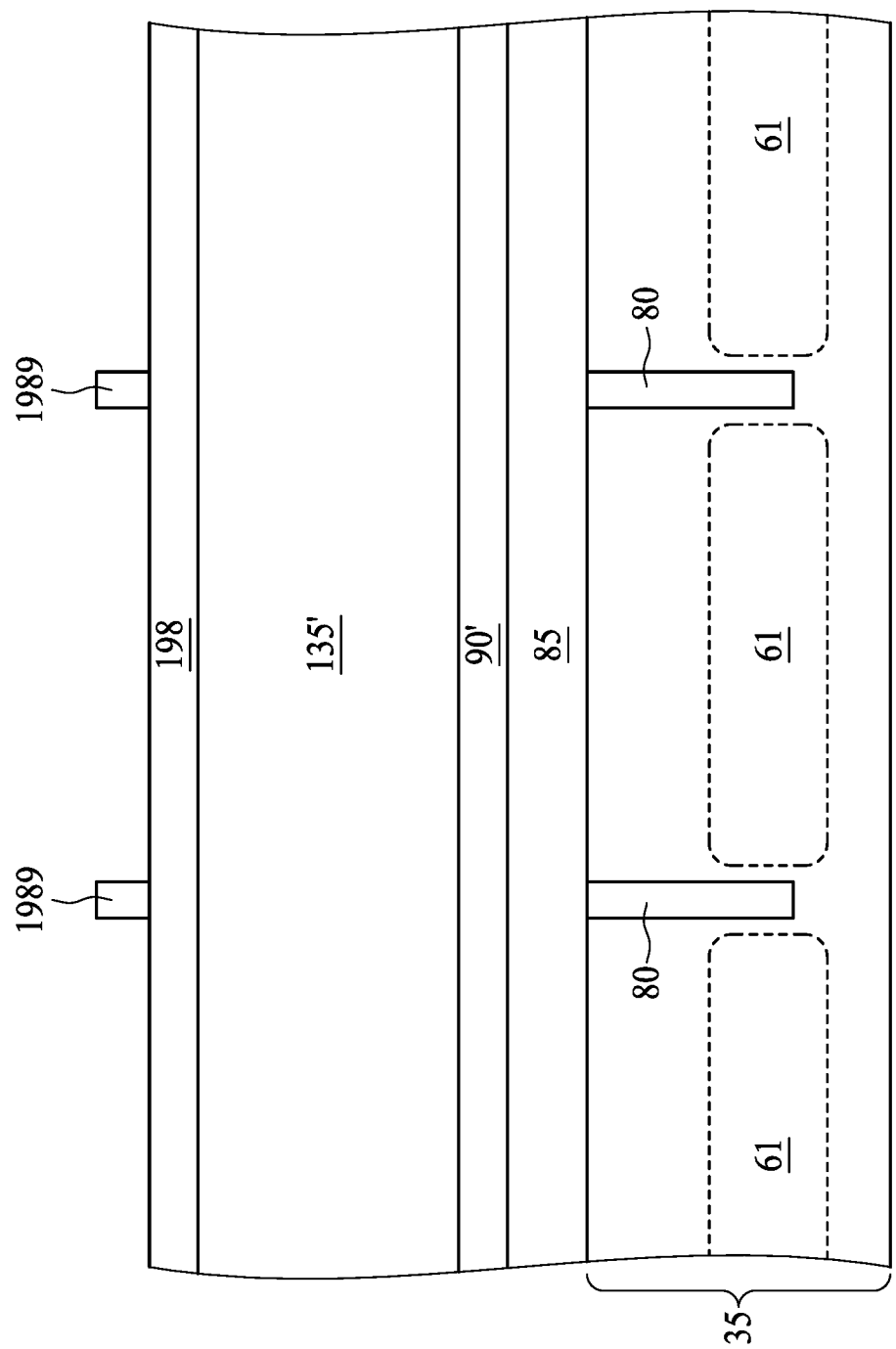

Referring to FIG. 6, FIG. 6 is a cross sectional view of an optical structure during intermediate stages of manufacturing operations, according to some embodiments of present disclosure. A first dielectric layer 135' is formed over the light transmission layer 85, or over the metal layer 90' if the metal layer 90' was previously formed above the light transmission layer 85. The first dielectric layer 135' may include oxide, such as silicon oxide ($SiO_2$), hafnium oxide ($HfO_2$), or the like. In some other embodiments, the first dielectric layer 135' may include organic material. An antireflective coating (ARC) layer 198 is formed above the first dielectric layer 135', and a photomask 1989 is formed above the antireflective coating (ARC) layer 198. The first dielectric layer 135' may be formed by a variety of techniques, such as chemical vapor deposition (CVD), physical vapor deposition (PVD), atomic layer deposition (ALD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other suitable operations. The antireflective coating (ARC) layer 198 may be formed by a variety of techniques, such as chemical vapor deposition (CVD), physical vapor deposition (PVD), atomic layer deposition (ALD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other suitable operations.

Figure 7:
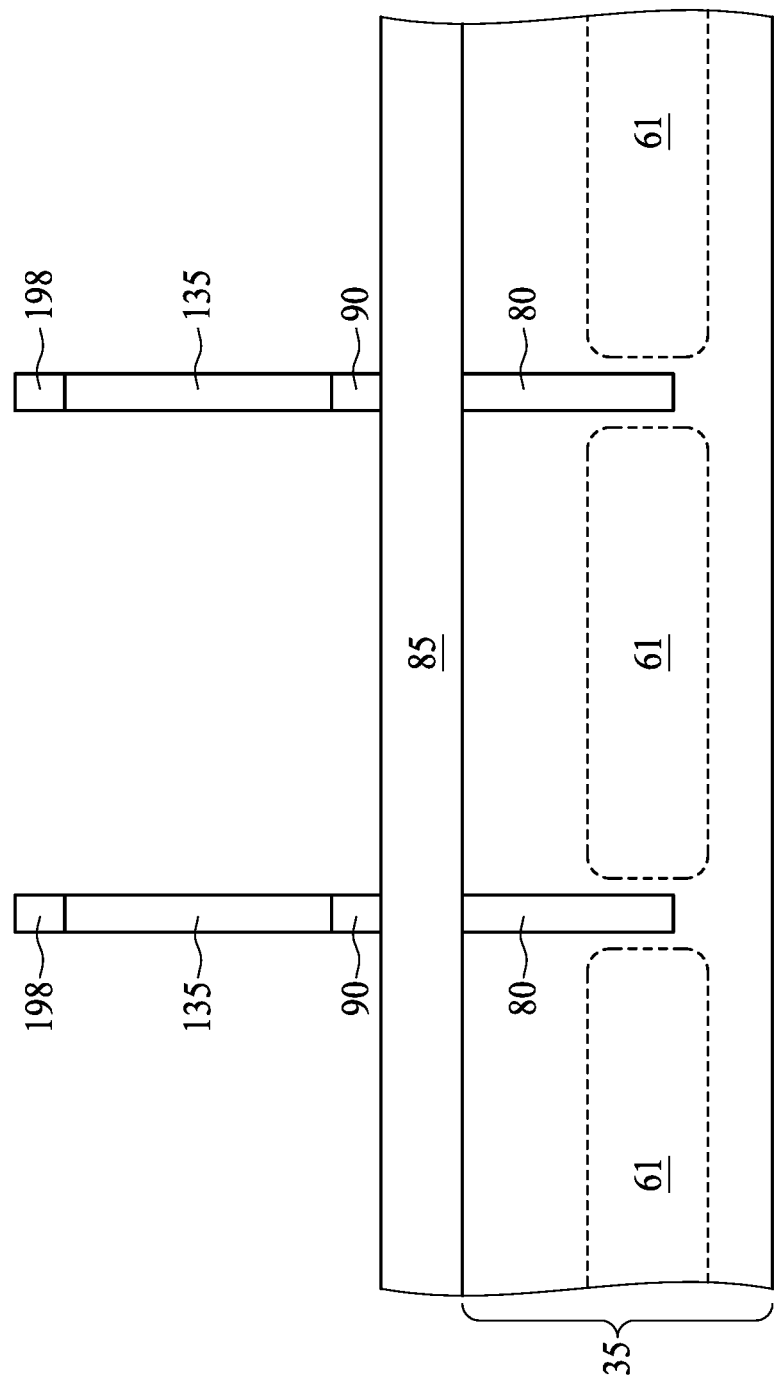

Referring to FIG. 7, FIG. 7 is a cross sectional view of an optical structure during intermediate stages of manufacturing operations, according to some embodiments of present disclosure. Subsequently a photolithography operation is performed, wherein the metal layer 90', the first dielectric layer 135', and the antireflective coating (ARC) layer 198 are patterned by the photomask 1989. Specifically, the metal layer 90' and the first dielectric layer 135' are patterned into the metal section 90 and the oxide section 135 respectively. It should be noted that the metal section 90 and the oxide section 135 may have a circular shape or a tetragonal shape from a top view perspective, which was previously discussed in FIG. 1A to FIG. 2B. Furthermore, the metal section 90 and the oxide section 135 (which would become a portion of the primary grid 130 subsequently) are vertically aligned with the isolation structure 80 in order to improve the alignment between an arrangement of each of the light detection region 61 and an arrangement of the corresponding oxide section 135 and/or the corresponding metal section 90. The photomask 1989 is subsequently removed.

Figure 8:
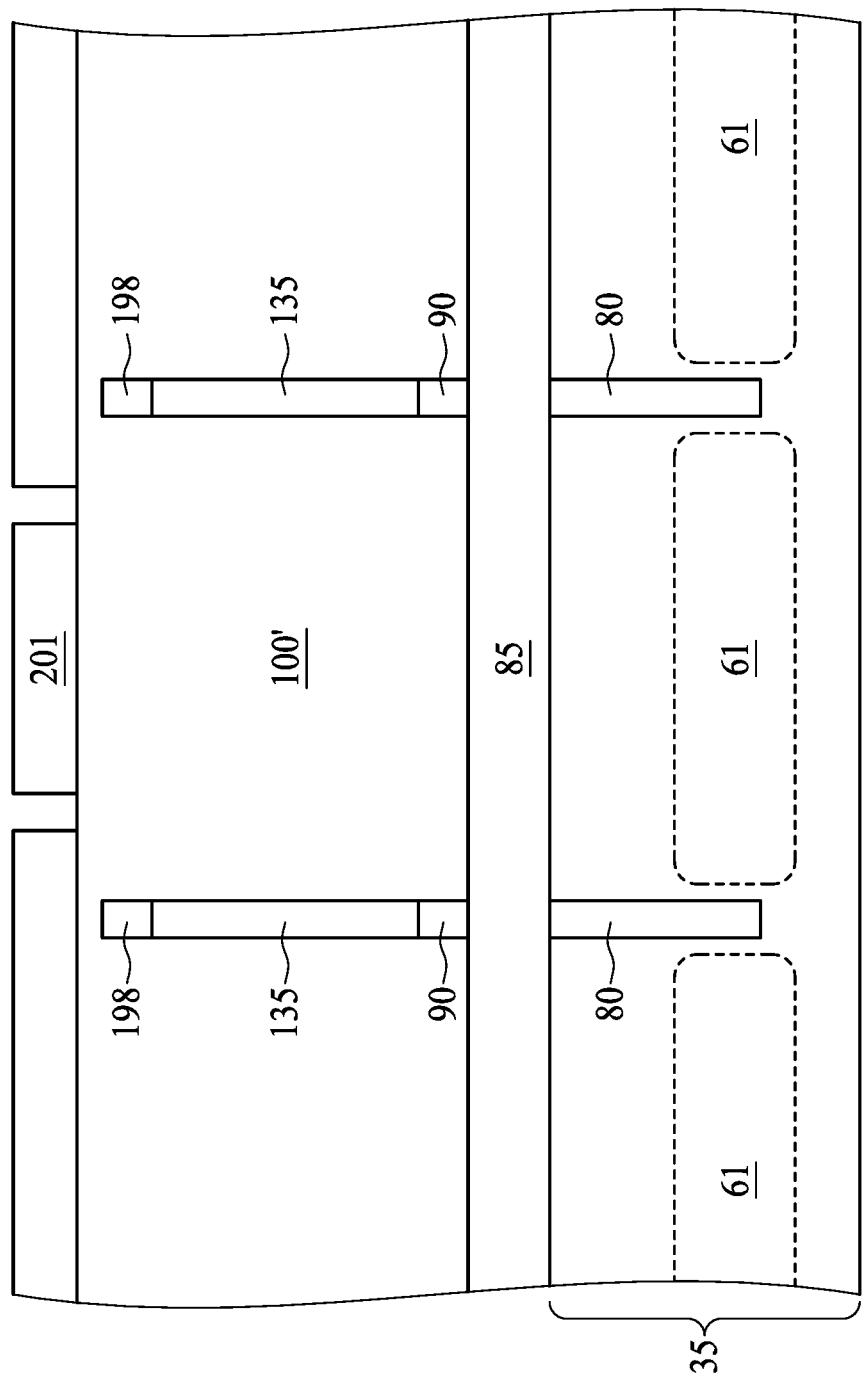

Referring to FIG. 8, FIG. 8 is a cross sectional view of an optical structure during intermediate stages of manufacturing operations, according to some embodiments of present disclosure. A second dielectric layer 100' is formed above the light transmission layer 85. Thereby the metal section 90, the oxide section 135, and the ARC layer 198 are inside the second dielectric layer 100' and surrounded by the second dielectric layer 100'. The second dielectric layer 100' may include oxide, such as silicon oxide ($SiO_2$), hafnium oxide ($HfO_2$), or the like. In some embodiments, a top surface of the second dielectric layer 100' may be above a top surface of the ARC layer 198. Subsequently, a first mask 201 is formed above the second dielectric layer 100'.

Figure 9:
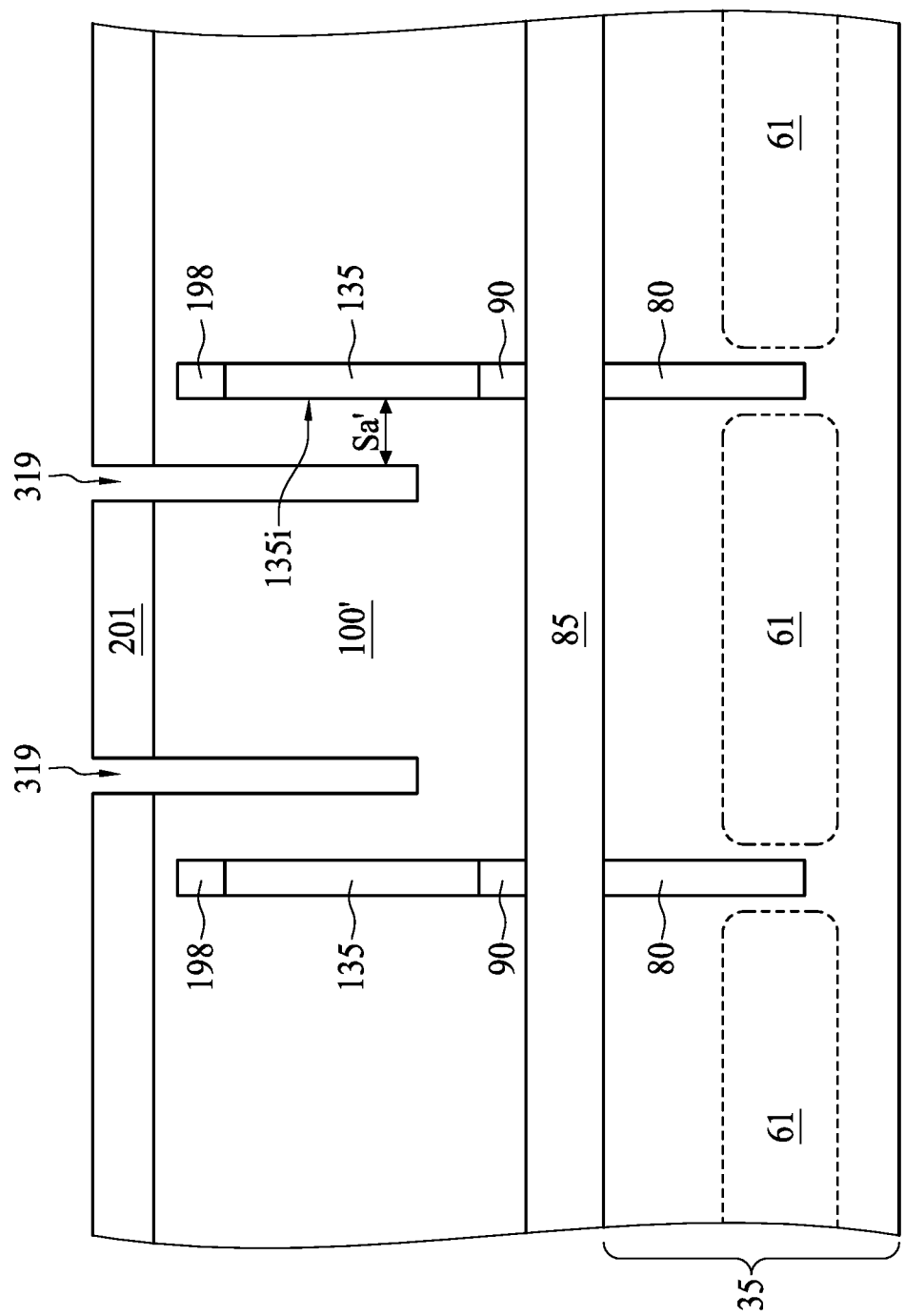

Referring to FIG. 9, FIG. 9 is a cross sectional view of an optical structure during intermediate stages of manufacturing operations, according to some embodiments of present disclosure. Subsequently, a trench 319 is formed by patterning the second dielectric layer 100' using the first mask 201. A bottom surface of the trench 319 is above a top surface of the light transmission layer 85. The trench 319 is laterally surrounded by the oxide section 135, and the trench 319 overlaps with the light detection region 61 from top view perspective. In some embodiments, a distance Sa' between an inner surface 135i of the oxide section 135 and a sidewall of the trench 319 is in a range from about 0.1 micron to about 0.5 micron. The distance may be predetermined based on various dimensional considerations, including, but not limited to, the final height and width of the secondary grid, the concentrating ability of the lens, and the like.

Figure 10:
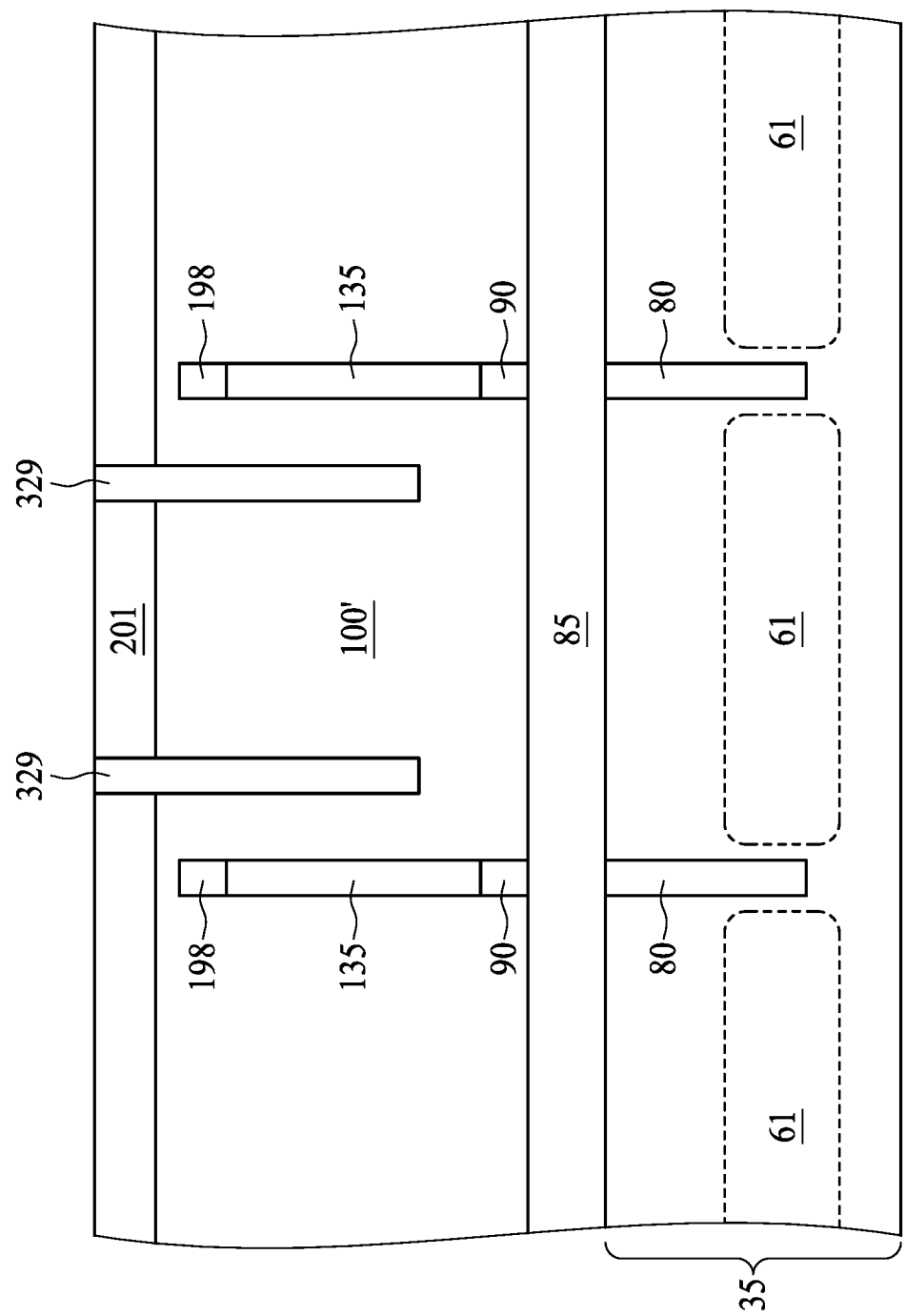

Referring to FIG. 10, FIG. 10 is a cross sectional view of an optical structure during intermediate stages of manufacturing operations, according to some embodiments of present disclosure. Subsequently, a filling material 329, for example, a photoresist, is filled in the trench 319. It is noteworthy that a distance is between a bottom surface of the filling material 329 and the top surface of the light transmission layer 85. An excess amount of the filling material 329 outside of the trench 319 and the first mask 201 are subsequently removed.

Figure 11:
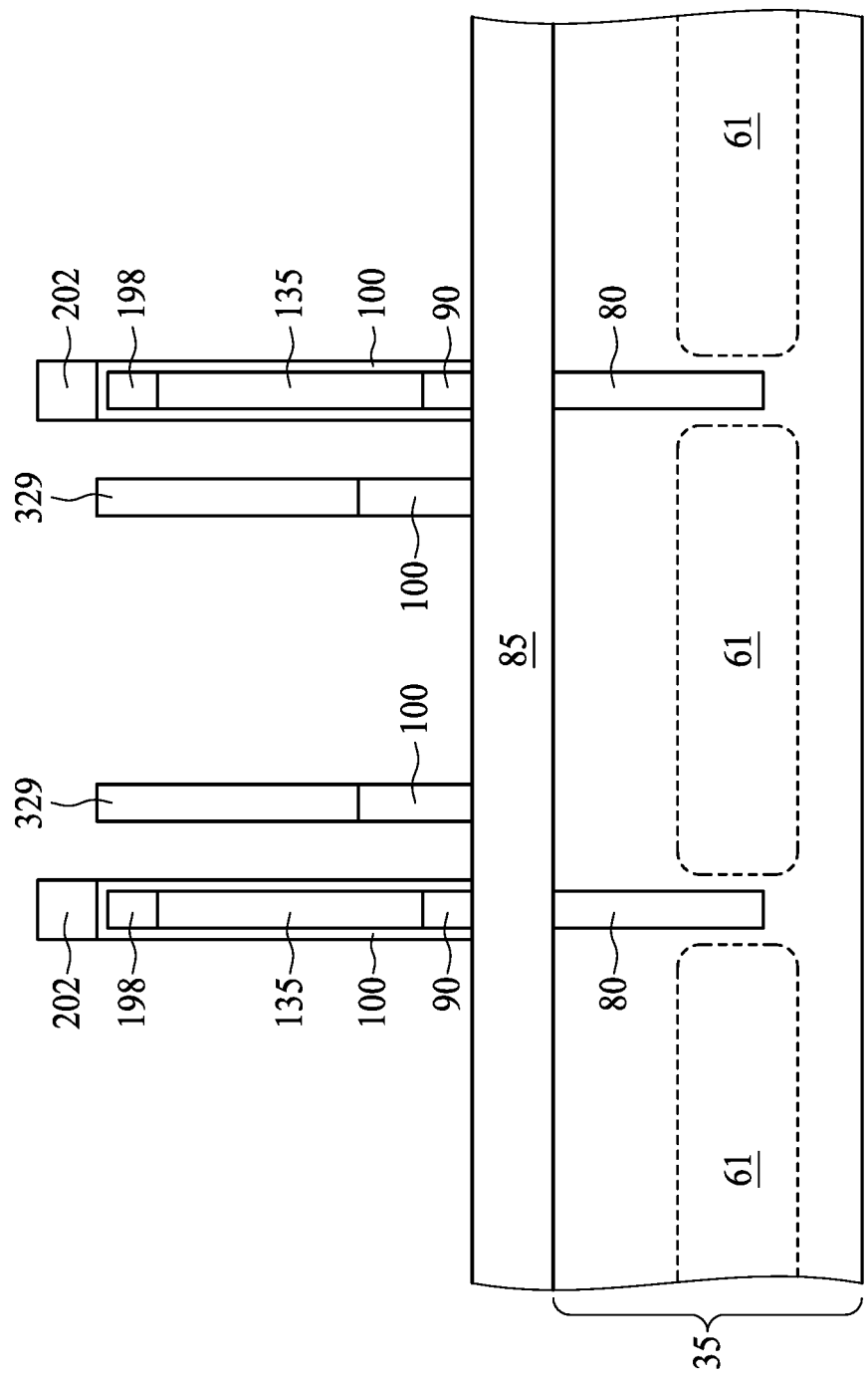

Referring to FIG. 11, FIG. 11 is a cross sectional view of an optical structure during intermediate stages of manufacturing operations, according to some embodiments of present disclosure. Subsequently a second mask 202 different from the first mask 201 is disposed above the second dielectric layer 100', and a photolithography operation is performed to pattern the second dielectric layer 100'. Specifically, a portion of the second dielectric layer 100' not covered by the filling material 329 and the second mask 202 is removed by the photolithography operation. Alternatively stated, a portion of the second dielectric layer 100' below the filling material 329 (referring to FIG. 10) and a portion of the second dielectric layer 100' covered by the second mask 202 (referring to FIG. 10) are remained. In some embodiments, a width of the second mask 202 is greater than a width of each of the metal section 90, the oxide section 135, and the ARC layer 198. Thereby the metal section 90, the oxide section 135, and the ARC layer 198 are surrounded by the remaining portion of the second dielectric layer 100' covered by the second mask 202, and such remaining portion of the second dielectric layer 100' are hereinafter denoted as a dielectric layer 100.

Figure 12:
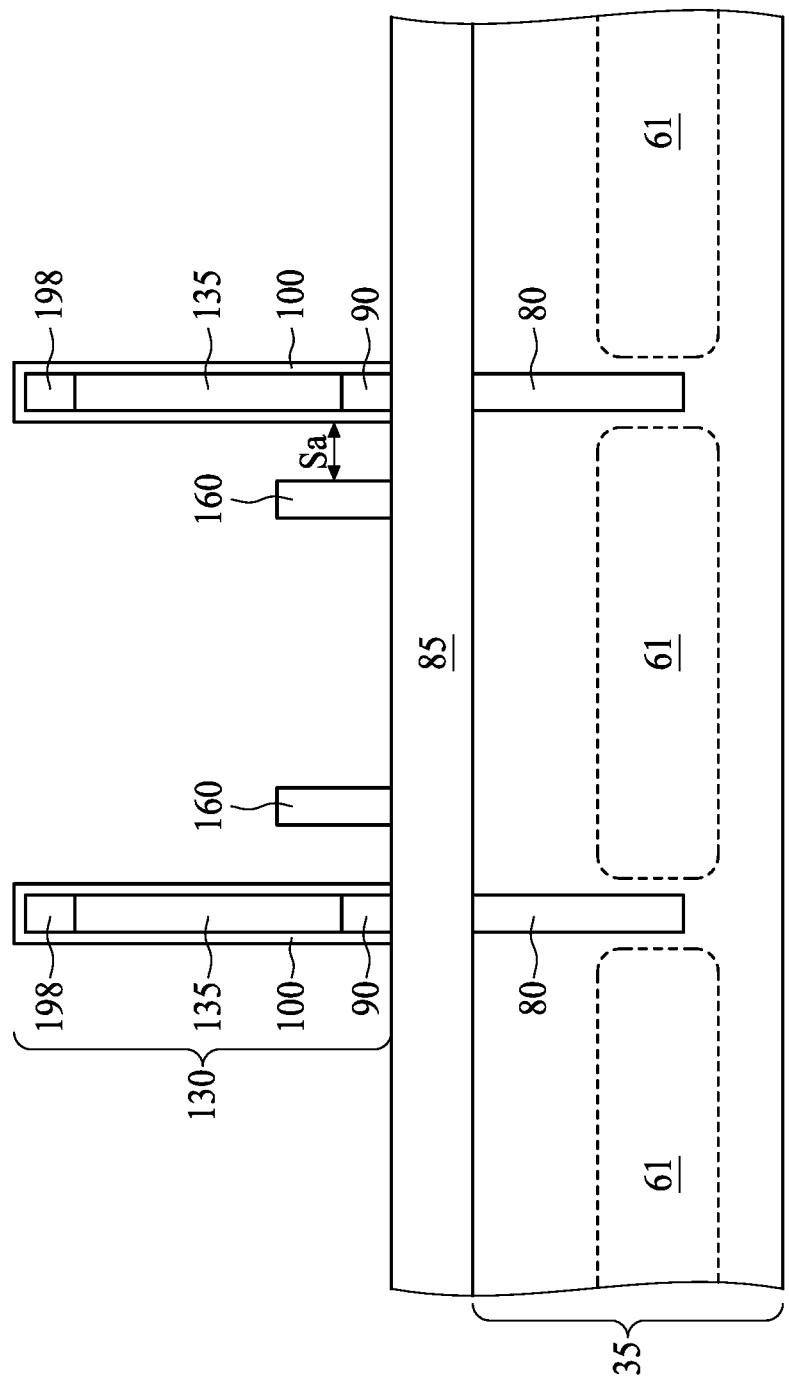

Referring to FIG. 12, FIG. 12 is a cross sectional view of an optical structure during intermediate stages of manufacturing operations, according to some embodiments of present disclosure. Subsequently the filling material 329 and the second mask 202 are removed. The remaining portion of the second dielectric layer 100' which was previously covered by the filling material 329 constitutes the secondary grid structure 160. It should be noted that a material of the secondary grid 160 may be identical with a material of the second dielectric layer 100'. In some alternative embodiments, other materials may be additionally deposited so that the secondary grid structure 160 includes composite material, for example, a combination of dielectric material and metallic material, a combination of organic material and metallic material, or the like. Furthermore, hereinafter the patterned metal section 90, the oxide section 135, the ARC layer 198 and the dielectric layer 100 are collectively denoted as the primary grid structure 130. Herein a height of the primary grid structure 130 is greater than a height of the secondary grid structure 160, while a separation Sa between an inner surface of the primary grid structure 130 and an outer surface of the secondary grid structure 160 may be in a range from about 0.1 micron to about 0.5 micron. In some embodiments, the height of the secondary grid structure 160 may be less than 0.5 micron (or in some embodiments from about 0.1 micron to about 0.5 micron). From a top view perspective, the secondary grid structure 160 is surrounded by the primary grid structure 130, as previously discussed and shown in FIG. 2A and FIG. 2B.

Figure 13:
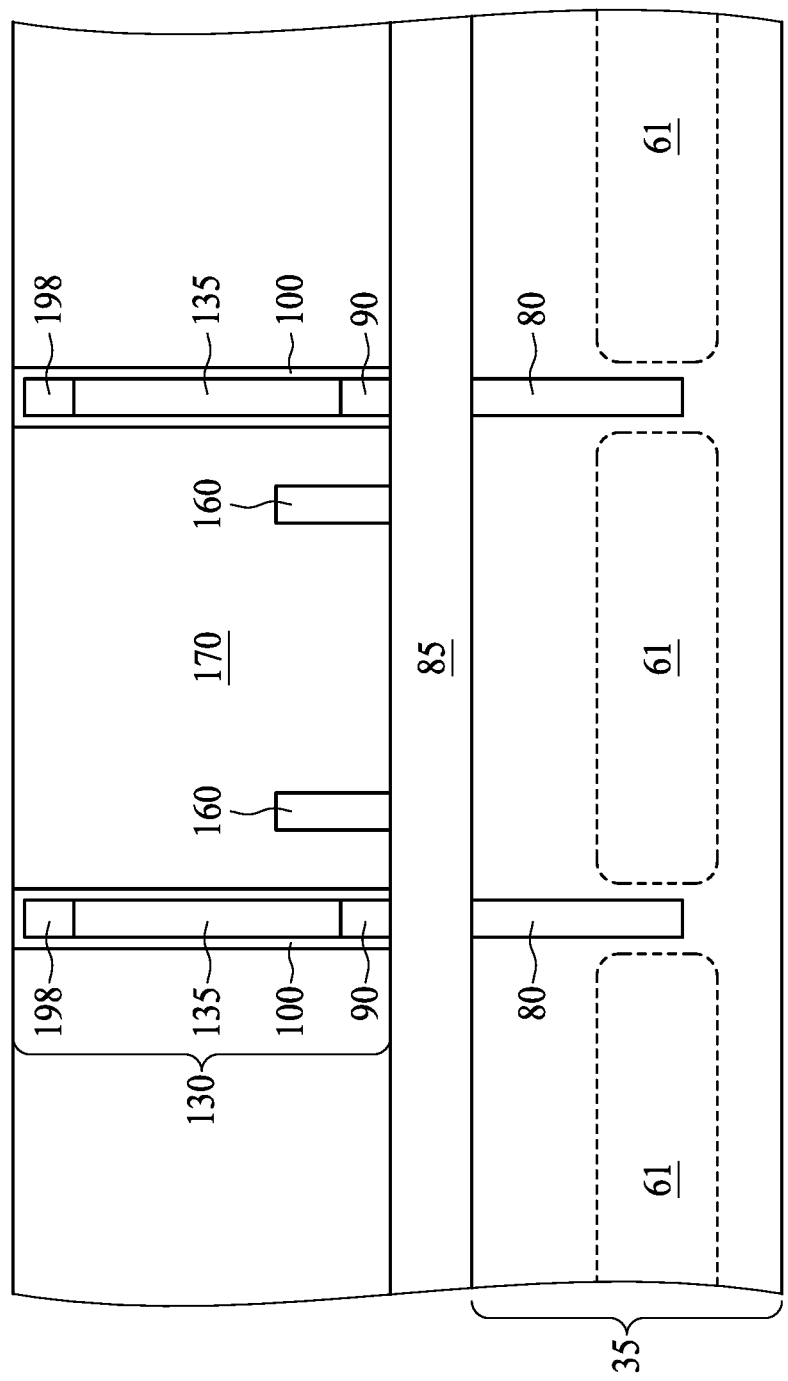

Referring to FIG. 13, FIG. 13 is a cross sectional view of an optical structure during intermediate stages of manufacturing operations, according to some embodiments of present disclosure. Subsequently the color filter 170 is formed over the light transmission layer 85, wherein the primary grid structure 130 and the secondary grid structure 160 are in the color filter 170. In some embodiments, the color filter 170 may include organic dielectric, such as polymer. Herein a refractive index of the color filter 170 is greater than a refractive index of the secondary grid structure 160 and a refractive index of the primary grid structure 130 (at least the oxide section 135 of the primary grid structure 130 and the metal section 90 if it is previously formed). In some embodiments, a thickness of the color filter 170 is identical with a height of the primary grid structure 130. Alternatively in some other embodiments, a thickness of the color filter 170 is greater than a height of the primary grid structure 130. In some embodiments, the thickness of the color filter is associated with the height of the secondary grid in a sense that compared to the embodiment where no secondary grid is presented, the thickness of the color filter in current embodiment may be greater than the one without secondary grid. For example, the thickness of the color filter in current embodiment may be greater than the thickness of the color filter without secondary grid by the thickness of the secondary grid. The excess thickness in current embodiment may compensate the deficient color filtering efficiency resulted from the presence of the secondary grid.

Figure 14:
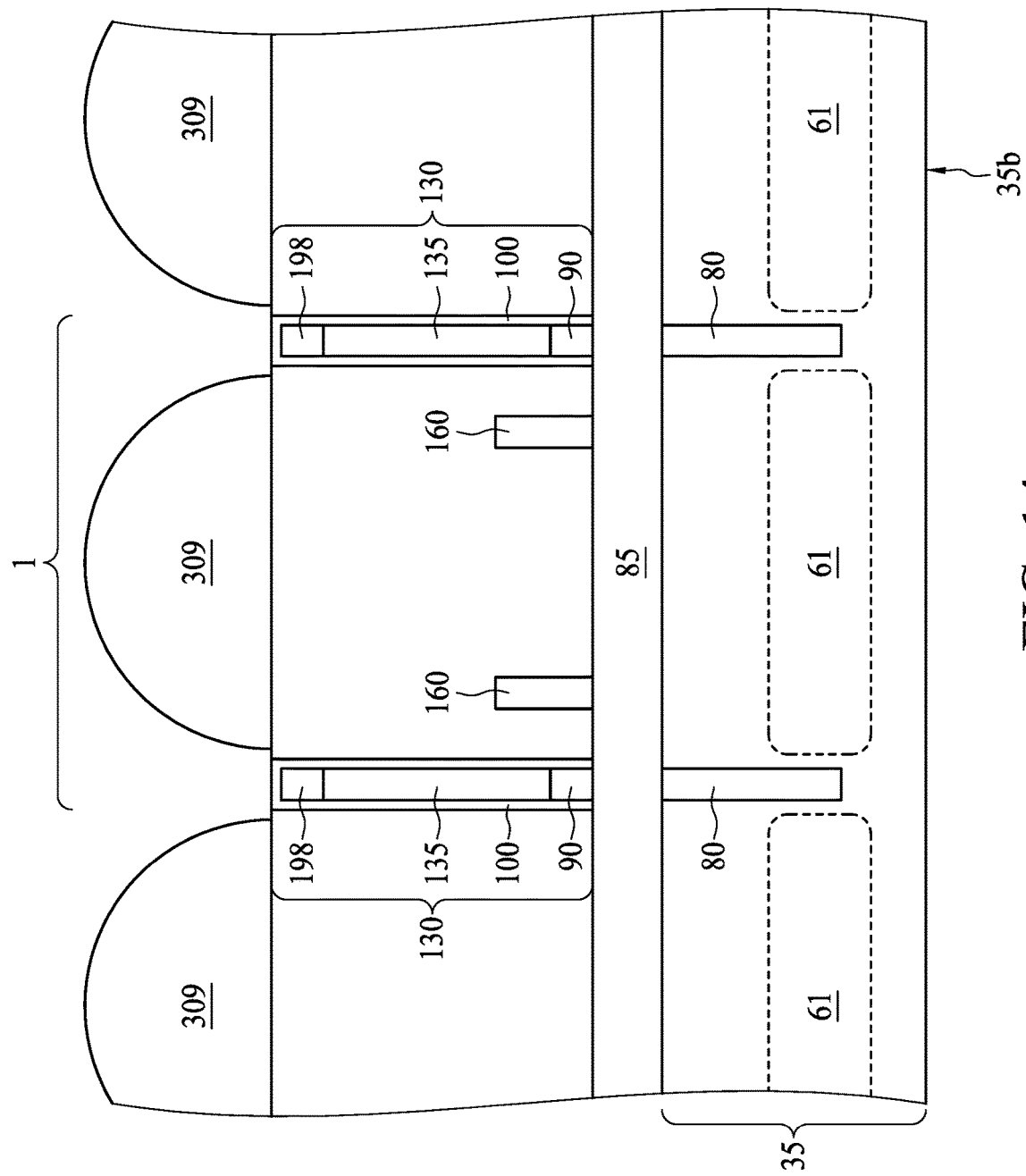

Referring to FIG. 14, FIG. 14 is a cross sectional view of an optical structure during intermediate stages of manufacturing operations, according to some embodiments of present disclosure. A lens 309 is formed above the color filter 170 and aligning with the light detection region 61. In some embodiments, the lens 309 may be a condensing lens, which may have a semi-ellipsoid, a hemisphere shape, or other suitable shape. A size of the lens 309 may be comparable to the size of the primary grid structure 130 from a top view perspective.

In some embodiments, a bonding pad and/or a solder bump (not shown in FIG. 14) may be formed on a side 35b of the substrate 35, wherein the side 35b faces away from the light transmission layer 85. The bonding pad and/or the solder bump may be electrically connected to a pixel formed in the light detection region 61 through a redistribution layer (RDL), and/or a conductive via. In some embodiments, the light detection region 61 is connected to a periphery region, which may include non-radiation-sensing devices, input/output circuitry, or logic circuitry, etc. In some embodiments, a portion of the substrate 35 is singulated by sawing through scribe regions (not shown in FIG. 14) surrounding the optical structure 1.

The present disclosure provides an optical structure including a primary grid structure 130 and a secondary grid structure 160 surrounded by the primary grid structure 130 to alleviate cross-talk issue without considerably trading off quantum efficiency (QE). Generally, when a width of a pixel in a light detection region becomes less than 1 micron, the risk of cross-talk significantly increases. Specifically, the secondary grid structure 160 may hinder the light from passing through a separation between the primary grid structure 130 and the isolation structure 80 to an extent. The secondary grid structure 160 a material having a lower refractive index than the surrounding color filter 170, thus the secondary grid structure 160 may reflect light in the color filter 170 by inducing reflection, thereby the reflected light may be guided to the intended light detection region 61, instead of erroneously directed to an adjacent light detection region 61. Furthermore, by patterning the second dielectric layer 100' by a first mask 201 to form a trench 319 and patterning the second dielectric layer 100' by a second mask 202 different from the first mask 201, the accuracy of positioning the secondary grid structure 160 may be improved.

Some embodiments of the present disclosure provide an optical structure, including a substrate, a light detection region in the substrate, an isolation structure in the substrate, surrounding the light detection region, a color filter layer over the substrate, and a dielectric grid structure in the color filter layer, the dielectric grid structure overlapping with the light detection region.

Some embodiments of the present disclosure provide an optical structure, including a substrate, a light detection region in the substrate, an isolation structure in the substrate defining the light detection region, a dielectric layer over the substrate, and a grid structure in the dielectric layer, wherein a first refractive index of the dielectric layer is greater than a second refractive index of the grid structure, and wherein more than one grid are overlapping with the light detection region.

Some embodiments of the present disclosure provide a method for fabricating an optical structure, including providing a substrate, forming a light detection region in the substrate, forming an isolation structure surrounding the light detection region, and forming a grid structure over the isolation structure, wherein forming the grid structure comprises, forming a primary grid over the isolation structure, and forming a secondary grid surrounded by the primary grid subsequent to forming the primary grid.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An optical structure, comprising:
   a substrate;
   a light detection region in the substrate;
   an isolation structure in the substrate, surrounding the light detection region;
   a color filter layer over the substrate;
   a dielectric grid structure free from vertical alignment with the isolation structure and comprising a top surface in direct contact with the color filter layer, the dielectric grid structure overlapping with the light detection region, and the dielectric grid structure comprises an inner sidewall laterally surrounding a portion of the color filter layer from a top view perspective;

a composite grid structure in the color filter layer and surrounding the dielectric grid structure, wherein a height of the composite grid structure is greater than a height of the dielectric grid structure, and the dielectric grid structure is free from being in direct contact with the composite grid structure; and a liner lining at a sidewall of the composite grid structure, a top surface of the liner is coplanar with a top surface of the color filter layer, and the liner is free from being in direct contact with the dielectric grid structure.

2. The optical structure of claim 1, wherein the dielectric grid structure comprises oxide.

3. The optical structure of claim 1, further comprising a light transmission layer connecting to the color filter layer at a first side and the substrate at a second side opposite to the first side.

4. The optical structure of claim 3, further comprising a lens over the color filter layer and facing the first side of the light transmission layer.

5. The optical structure of claim 1, wherein the composite grid structure comprises a metal section and a dielectric section.

6. The optical structure of claim 1, wherein the composite grid structure is vertically aligned with the isolation structure.

7. The optical device of claim 1, wherein the isolation structure is a backside deep trench isolation (BDTI).

8. The optical structure of claim 5, wherein the dielectric section is directly above the metal section.

9. An optical structure, comprising:
a substrate;
a light detection region in the substrate;
an isolation structure in the substrate defining the light detection region;
a dielectric layer over the substrate;
a grid structure in the dielectric layer, comprising a primary grid vertically overlapping with the isolation structure and a secondary grid surrounded by the primary grid, wherein the secondary grid is free from being in direct contact with the primary grid, a height of the primary grid is greater than a height of the secondary grid, a first portion of the dielectric layer is above a top surface of the secondary grid, and a second portion of the dielectric layer is laterally surrounded by an inner sidewall of the secondary grid from a top view perspective; and
a liner lining at a sidewall of the primary grid, a top surface of the liner is coplanar with a top surface of the dielectric layer, and the liner is free from being in direct contact with the secondary grid.

10. The optical structure of claim 9, wherein one of the primary grid and the secondary grid comprises a single material.

11. The optical structure of claim 9, wherein the primary grid is closer to the isolation structure than the secondary grid.

12. The optical structure of claim 9, wherein the secondary grid and the primary grid are composed of different materials.

13. The optical structure of claim 9, further comprising a lens over the dielectric layer, wherein a portion of the primary grid is free from being under a coverage of a vertical projection area of the lens.

14. An optical structure, comprising:
a substrate comprising a light detection region;
a color filter over the substrate;
an isolation region laterally surrounding the light detection region; and
a grid structure over the substrate, wherein the grid structure comprises:
a primary grid over the isolation region, wherein the primary grid comprises a liner lining at a sidewall of the primary grid, and a top surface of the liner is coplanar with a top surface of the color filter; and
a secondary grid surrounded by the primary grid, wherein the primary grid is free from being in direct contact with the secondary grid, the liner is free from being in direct contact with the secondary grid, and a first portion of the color filter is laterally surrounded by an inner sidewall of the secondary grid from a top view perspective.

15. The optical structure of claim 14, further comprising a light transmission layer between the grid structure and the isolation region, wherein a portion of the light transmission layer is exposed from a gap between the primary grid and the secondary grid.

16. The optical structure of claim 14, further comprising a lens above the light detection region, wherein the primary grid is free from being under a coverage of a vertical projection area of the lens.

17. The optical structure of claim 14, wherein a second portion of the color filter is between the primary grid and the secondary grid.

18. The optical structure of claim 14, wherein the primary grid comprises an oxide portion and a metal portion.

19. The optical structure of claim 15, wherein at least a portion of the light transmission layer is free from being under a coverage of a vertical projection area of the liner.

20. The optical structure of claim 14, wherein a height of the primary grid is greater than a height of the secondary grid.

* * * * *